(12) United States Patent
Baer

(10) Patent No.: US 11,377,758 B2
(45) Date of Patent: *Jul. 5, 2022

(54) CLEAVING THIN WAFERS FROM CRYSTALS

(71) Applicant: Stephen C. Baer, Arlington, MA (US)

(72) Inventor: Stephen C. Baer, Arlington, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/102,130

(22) Filed: Nov. 23, 2020

(65) Prior Publication Data

US 2022/0162771 A1     May 26, 2022

(51) Int. Cl.
*C30B 33/04* (2006.01)
*B23K 26/53* (2014.01)

(52) U.S. Cl.
CPC ............. *C30B 33/04* (2013.01); *B23K 26/53* (2015.10)

(58) Field of Classification Search
CPC ................................ C30B 33/04; B23K 26/53
See application file for complete search history.

(56) References Cited

U.S. PATENT DOCUMENTS

| | | | |
|---|---|---|---|
| 4,237,601 A | 12/1980 | Woolhouse et al. |
| 4,244,348 A | 1/1981 | Wilkes |
| 5,529,051 A | 6/1996 | Miller |
| 5,985,742 A | 11/1999 | Henley et al. |
| 5,994,207 A | 11/1999 | Henley et al. |
| 6,013,367 A | 1/2000 | Henley et al. |
| 6,033,974 A | 3/2000 | Henley et al. |
| 6,120,397 A | 9/2000 | Levy et al. |
| 6,284,631 B1 | 9/2001 | Henley et al. |
| 6,291,313 B1 | 9/2001 | Henley et al. |
| 6,441,297 B1 | 8/2002 | Keller et al. |

(Continued)

OTHER PUBLICATIONS

Suwito et al., Fracture initiation at sharp notch in single crystal silicon, J.Appl.Phys, Apr. 1, 1998, 3574-3582, vol. 83 No. 7. Am. Inst. Physics, USA.

(Continued)

*Primary Examiner* — Robert M Kunemund

(57) ABSTRACT

A method of creating thin wafers of single crystal silicon, sapphire and similar materials, wherein an ingot of single crystalline material, or a ribbon of single crystalline material is cleaved, in a plane parallel to a surface, with laser light focused to a line in the desired plane of cleavage, near the growing cleavage furrow. The light is of a wavelength that the material is transparent to, but for which the material has strong two- or three-photon absorption. Consequently the light is not appreciably absorbed until it reached the desired focal line. The light is presented in an extremely short pulse, which heats and expands the material at the line focus, before the heat can be dissipated. This expansion creates tangential stresses around the focal line. These stresses are designed to be precisely normal to the growing cleavage furrow. Therefore the stresses are able to induce cleavage in the desired plane, without inducing cleavage in other possible cleavage planes that may happen to intersect with the growing cleavage edge. In this way, extremely thin wafers and ribbon shaped wafers can be produced, with extremely high quality cleaved faces. Methods of initiating the cleavage furrow and separating the cleaved wafer from the rest of the crystal are also discussed.

9 Claims, 10 Drawing Sheets

(56) References Cited

U.S. PATENT DOCUMENTS

| | | | |
|---|---|---|---|
| 6,513,564 | B2 | 2/2003 | Bryan et al. |
| 6,723,952 | B2 | 4/2004 | Choo et al. |
| 6,750,118 | B2 | 6/2004 | Kray et al. |
| 6,828,216 | B2 | 12/2004 | Schwarzenbach et al. |
| 6,958,094 | B2 | 10/2005 | Ohmi et al. |
| 7,052,978 | B2 | 5/2006 | Shaheen et al. |
| 8,361,883 | B2 | 1/2013 | Fukuyo |
| 8,685,838 | B2 | 4/2014 | Fukuyo |
| 8,835,802 | B2* | 9/2014 | Baer ................ B23K 26/40 219/121.67 |
| 8,895,345 | B2 | 11/2014 | Akiyama |
| 10,843,297 | B2* | 11/2020 | Baer ................ H01L 31/072 |
| 2003/0179786 | A1 | 9/2003 | Kopf |
| 2004/0232124 | A1 | 11/2004 | Nagai |
| 2005/0070071 | A1 | 3/2005 | Henley et al. |
| 2005/0173683 | A1 | 8/2005 | Marder et al. |
| 2005/0287768 | A1 | 12/2005 | Owens |
| 2009/0056513 | A1* | 3/2009 | Baer ................ B23K 26/40 83/15 |
| 2013/0156989 | A1* | 6/2013 | Moriceau ............ B32B 7/02 428/64.1 |

OTHER PUBLICATIONS

Burghoff et al., Photonics in silicon using mid-IR femtosecond pulses, Proc.SPIE, 2005, 245-252, vol. 5714, SPIE, USA.

Sysoev et al. Increasing the efficiency of controllable laser thermal cleavage of insulating materials, J. Opt. Technol., 2004, 117-120 vol. 71, Opt. Soc. of Am., USA.

Lomonosov et al. Impulsive fracture of silicon by elastic pulses with shocks. Phys.Rev.Lett., 2002, 095501-1-095501-4, vol. 89, Am. Phys. Soc. USA.

Ueda et al. Thermal Stress Cleaving of Brittle Materials by Laser Beam, Annals CIRP, 2002, 149-152, vol. 51, Technische Rundschau, Hallwag, Switzerland.

Yamada, et al., Thermal damage of silicon wafer in thermal cleaving process with pulsed laser and CW laser, Proc. SPIE, 2006, 61070H-1-61070H-10 vol. 6197, SPIE, USA.

Lumley, Controlled separation of brittle materials using a laser, Ceramic Bulletin, 1969, 850-854, vol. 48, Am. Ceramic Soc. USA.

Anonymous, Stealth dicing technology and applications, Hamamatsu Technical Information, 2005, 8 pages, Hamamatsu K. K., Japan.

Nejadmalayeri et al., Inscription of optical waveguides in crystalline silicon by mid-infrared femtosecond laser pulses. Opt.Lett., 2005, 964-966, vol. 30, Opt. Soc. Am., USA.

Hauch et al.,Dynamic fracture in single crystal silicon. Phys. Rev. Lett., 1999, 2823-2826, vol. 82, Am. Phys. Soc. USA.

Friedmann et al. Laser Wafering for Silicon Solar. Sandia Report SAND2011-2057 Jan. 2011. Sandia National Laboratories. USA.

Krejcik et al. A method of cleaving extremely thin crystals. J. Phys. E: Sci. Instrum. 1981 919-920 Vol 14 The Institute of Physics UK.

* cited by examiner

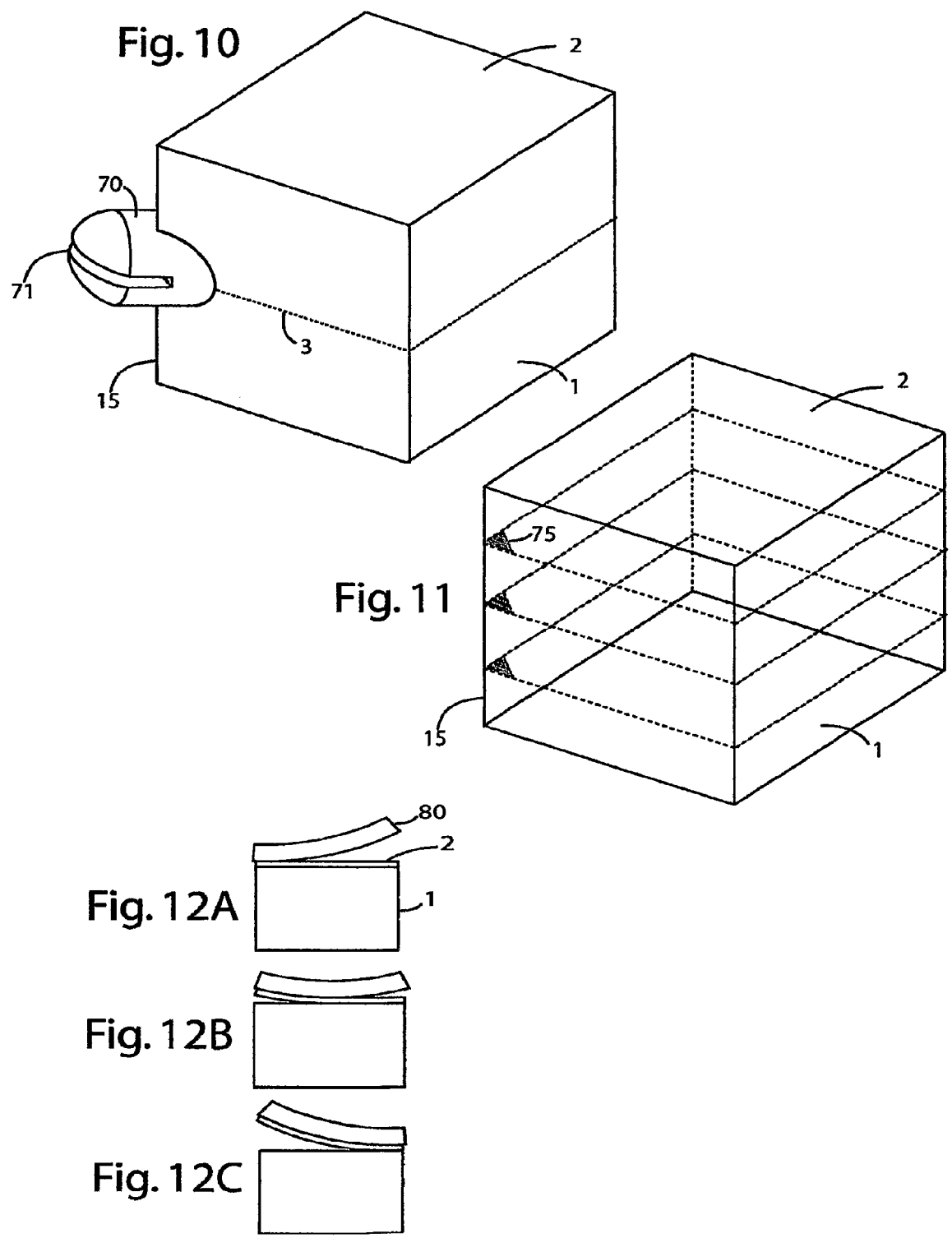

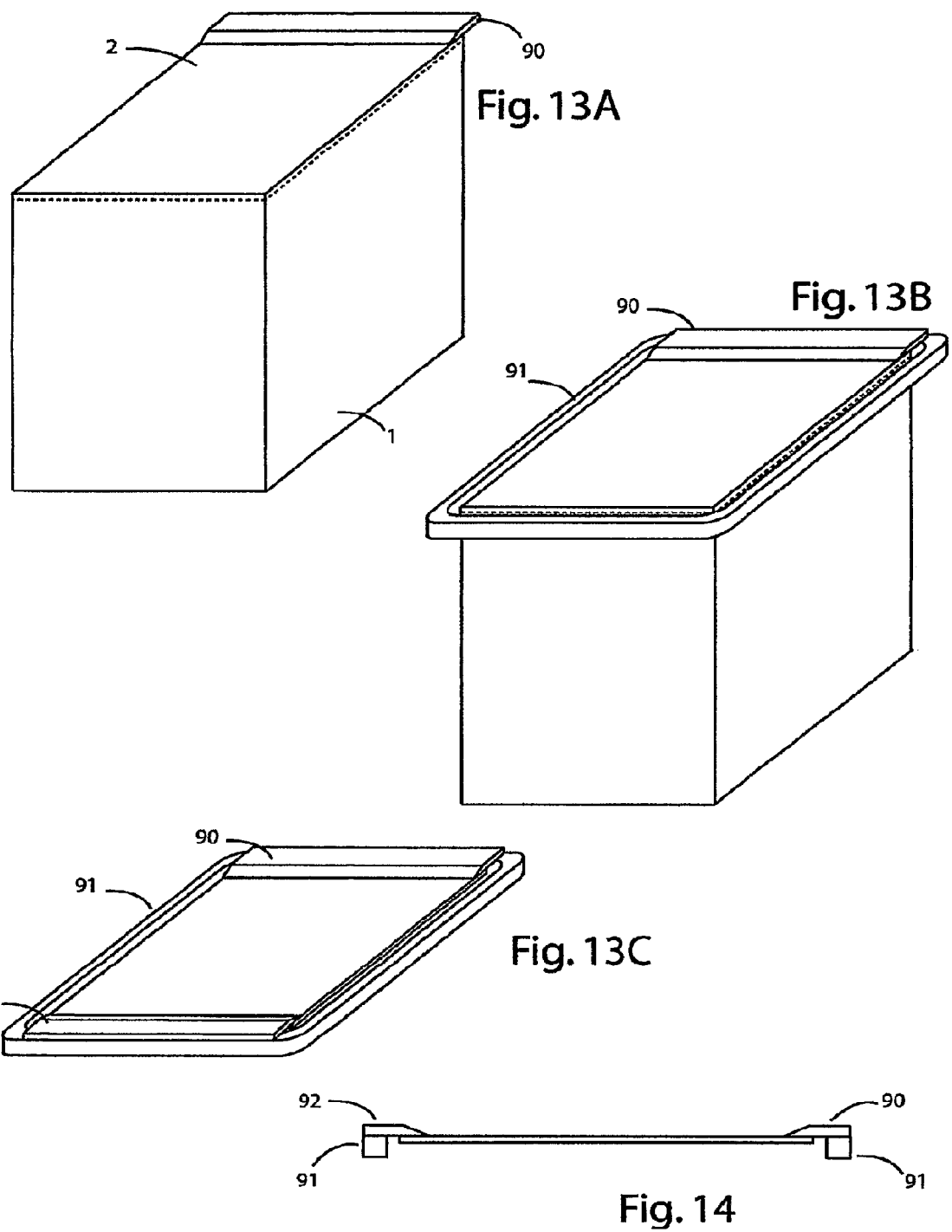

CLEAVING THIN WAFERS FROM CRYSTALS

CROSS REFERENCE TO RELATED APPLICATIONS

This application claims priority from U.S. Provisional Patent Application Ser. No. 60/761,547 filed Jan. 24, 2006, from U.S. Provisional Patent Application Ser. No. 60/745,035 filed Apr. 18, 2006, from U.S. Provisional Patent Application Ser. No. 60/745,759 filed Apr. 27, 2006, from U.S. Provisional Patent Application Ser. No. 60/808,553 filed Jul. 5, 2006, and from U.S. patent application Ser. No. 12/162,033 filed Jan. 24, 2008, now U.S. Pat. No. 8,835,802, and from U.S. patent application Ser. No. 15/330,981 filed Sep. 15, 2014, now U.S. Pat. No. 10,943,297, the entire disclosures of which are hereby incorporated by reference.

FIELD OF THE INVENTION

The present invention relates to the technology of making wafers from crystalline materials such as silicon or sapphire, and in particular to the problem of cleaving thin wafers, including wafers elongated into ribbons, from single-crystals of such materials.

DESCRIPTION OF THE PRIOR ART

The present application is a continuation-in-part of U.S. patent application Ser. No. 12/162,033, which taught the use of precisely focused lasers of carefully chosen parameters to cleave wafers from single crystals. That application focused on crystals of silicon, but the application made it clear that the method was not limited to silicon, and could be applied to cleaving thin wafers from crystals of a wide variety of materials, including those sometimes thought to be difficult or impossible to cleave. The necessary property of the material was that there was a wavelength at which the material was transparent, but where an ultrafast pulse of light at such wavelength was focused into the material to a focal region, there could be absorption at the focal region by multiphoton absorption. The present continuation-in-parts still discusses silicon, but emphasizes that generality by discussing application of the method to crystals of sapphire in addition to those of silicon.

Most photovoltaic solar cells produced today are based on crystalline silicon, either single-crystal silicon or polycrystalline silicon. The single-crystal silicon cells convert solar energy more efficiently, but are more expensive. Because the cost of the silicon substrate is currently a major component in the cost of these cells, any improvement that enabled practical and low cost production of thinner single-crystal silicon wafers could significantly lower the cost of the cells, and enable the production of a cell that was both efficient and economical.

Two methods for producing wafers from ingots of single-crystal silicon are 1) sawing them, followed by removal of the saw-damaged superficial layers and polishing and 2) creating a subsurface layer of weakened silicon by means of ion implantation, generally by hydrogen ion beams, followed by attachment of a stiffening layer to the top surface and removal of the stiffening layer and the top surface as a unit from the crystal (Bruel, U.S. Pat. No. 5,374,564). The sawing method results in much wasted silicon, and this wasted silicon adds a significant cost to solar cells produced from the wafers. The sawing also produces wastes that must be dealt with through recycling or disposal, adding additional economic and environmental cost to the cells. Furthermore there is added expense from removal of the damaged surface, polishing and cleaning the individual wafers before further processing can take place.

The ion beam deposited layer method is practically limited to wafers that are less than 10 microns in thickness because of the energy requirements of the penetrating ion beam. Furthermore, it requires a relatively long cycle time between the production of successive wafers from the ingot. It requires cycling between different vacuum and temperature environments. The ion beam can transfer contaminants to the wafer. Finally, because of crystal surface damage left after separation, the newly produced wafer requires removal of the superficial layer and polishing. While this ion beam process is currently used in the production of silicon-on-insulator wafers, where the thinness of the resulting silicon layers offers performance advantages, and where the relatively high costs per wafer can be absorbed in the value added to the wafer by integrated circuit manufacture, it would be prohibitively expensive for silicon solar cell production.

In theory, cleavage of a thin layer from the end of a single-crystal ingot of silicon could produce wafers with intrinsically perfect surfaces, requiring no further polishing, and with no loss of material due to sawing. However in view of the brittleness of silicon, no technique that avoids the need for creation of a weakened layer by ion implantation has yet proven to be a practical method for cleaving wafers from single-crystal silicon with both the thinness and the area economical for solar cells.

Currently sapphire wafers are made by three different methods, 1) sawing wafers from boules of single crystal sapphire, 2) drawing ribbons from a melt, and 3) vapor depositing a layer of sapphire on a substrate and then freeing the newly formed sapphire layer from the substrate. The first of these methods is costly, in view of the hardness of sapphire, and the needed smoothing and polishing operations following sawing. The method also involves loss of materials due to the kerf in the sawing process. Furthermore this method is intrinsically incapable of producing long ribbons of sapphire that could be used in roll to roll processes. The second of these methods can produce long ribbons, but there are limitations how thin the sapphire can be. And the third of these methods requires costly processing techniques. So there is an unmet need for a process capable of economically producing very thin ribbons of sapphire with high quality surfaces.

OBJECTS AND ADVANTAGES

One object of the present invention is to provide an economical method of production of wafers and ribbons of silicon, sapphire and other crystalline materials.

Another object is to provide a silicon wafer production method that involves no wasted material due to saw kerf.

Another object is to provide such a method that produces wafers that are intrinsically smooth enough to require little or no additional polishing.

Another object is to provide such a method where wafers are produces in a state that requires no further cleaning before additional processing.

Another object of the present invention is to provide such a cleavage method that can operate at room temperature.

Another object is to provide stresses to cleave the silicon, sapphire and similar materials that are greatest at the growing edge of the cleavage, and are low other places, particularly at the vulnerable outer surfaces of the crystal.

Another object is to provide such a method that provides a rapid cycle time between production of successive wafers from the same ingot.

Another object is provide a method of making wafers and ribbons as thin as 25 microns, or even thinner, without requiring additional smoothing and polishing.

Another object is to provide wafer production by a method that introduces substantially no impurities into the wafer or ribbon.

Another object is to provide a technique for wafer production where wafer area is limited only by the cross sectional area of available ingots.

Another object is to reduce the waste products in wafer production, thereby reducing the environmental and economic cost of the finished solar cell.

Another object of the invention is to economically produce crystalline ribbons wherein two ribbons of different crystalline materials are laminated to produce a laminate having electrical, optical and/or mechanical properties superior to those of either of the individual materials.

SUMMARY OF THE INVENTION

An ingot of single-crystal silicon with a (111) axis is flattened and polished at one end normal to the axis, and a notch with a vertex in the (111) plane is produced on a side of the ingot, such that the distance between this vertex and said end is the desired thickness of a wafer to be cleaved from the ingot and such this vertex is in the desired plane of cleavage. Light of a wavelength able to penetrate into the silicon crystal without significant absorption, when the intensity of the beam is low, but is efficiently absorbed and converted to heat when the intensity of the beam is high, is focused to an elongated volume with an axis of elongation in the desired cleavage plane, parallel to and a short distance from said notch edge. Heating and the resulting transient local expansion of the silicon in this illuminated volume causes tensile stress at the vertex of said notch, substantially normal to the desired cleavage plane, thereby causing fracture of the crystal in the chosen cleavage plane. Movement of the illuminated volume relative to the ingot allows the fracture to propagate across the desired cleavage plane, thereby completely severing the wafer from the rest of the ingot. This same process can also be applied to cleaving a crystalline ribbon of silicon, sapphire or some other crystalline material, produced by various processes in a plane parallel to the face of the ribbon, thus generating thinner ribbons.

SUMMARY OF THE DRAWINGS

FIG. 10 is a three-dimensional view showing apparatus for producing a set of short parallel cleavage fractures normal to one edge of a rectangular ingot.

FIG. 11 is a three-dimensional view showing an ingot after processing by the apparatus illustrated in FIG. 10.

FIGS. 12A, 12B and 12C are schematic cross sectional views showing three successive time points in a process for peeling a cleaved wafer from the balance the ingot from which it was cleaved.

FIGS. 13A, 13B and 13C are three-dimensional views showing how a newly cleaved wafer can be mounted in a supporting frame for further processing.

FIG. 14 is a schematic cross sectional view showing the relationship between the wafer and the supporting frame.

DETAILED DESCRIPTION OF THE PREFERRED EMBODIMENT OF THE INVENTION

Figure 1:
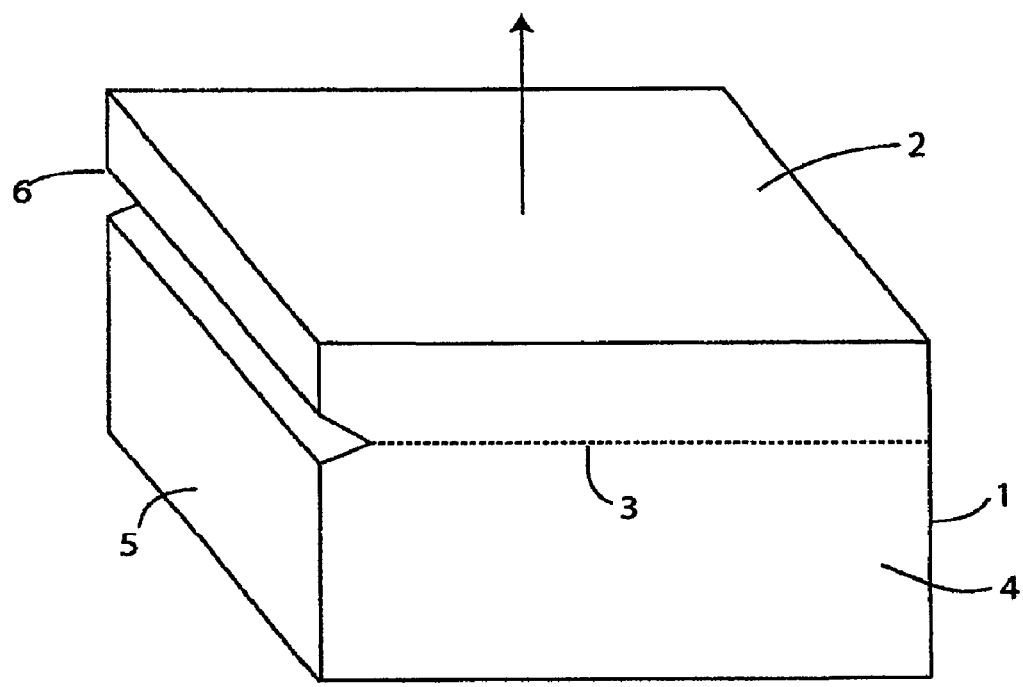
FIG. 1 shows a three-dimensional view of the silicon ingot showing its crystal axis and the plane of the desired cleavage.

FIG. 1 shows an ingot 1 of single-crystal silicon. To simplify the present discussion, ingot 1 has been ground to a rectangular prism shape. One face 2 of the ingot, normal to the main crystal axis (identified by an arrow), is ground and polished, and will serve as one face of the first wafer to be cleaved from the ingot by the method of the present invention. The desired cleavage plane is parallel to face 2 and is shown by the dotted line 3 where it intersects a face 4 of ingot 1 perpendicular to face 2. On another face 5 of ingot 1, perpendicular to both faces 2 and 4, is a notch 6 with a vertex in the desired cleavage plane. Since the (111) plane is the cleavage plane of silicon, the main axis of ingot 1 is oriented in the (111) direction. In practice, in order to maximize utilization of the full cross sectional area of the silicon ingot, the ingot might be left in its existing cylindrical shape, with notch 6 produced on one side. Furthermore, the ideal location of the notch is on the edge formed by two intersecting planes ground on the sides of an ingot, for example to form a rectangular ingot.

To promote cleavage, notch 6 should terminate in as sharp a vertex as possible. One way to create a notch with a sharp vertex is to use photolithography to create a narrow slot in a photoresist layer on face 5 so that a narrow strip of silicon can be exposed to a chemical etching solution, such as KOH, which at 80° C., etches (100) planes 400 times more rapidly than (111) planes resulting in sharp edges at the intersections of two (111) planes (Suwito et al., J. Appl. Physics 83:3574 (98)). To use that etching procedure, the notch should be at the intersection of two (111) planes, one of which is the desired cleavage plane, and the other of which is oriented at 70.5° with respect to that plane. The resulting notch will be a sawtooth. The notches might also be made by any other method that may produce sharp notches in silicon, such milled in the silicon by a focused ion beam, produced by a focused pulsed uv laser, or produced by an extremely sharp diamond blade. In the case of a notch made with an extremely sharp diamond blade, the notch could be made at the time of the laser pulse, by contacting the ingot with the blade in substantial synchrony with the pulse, so as to have a synergistic effect in initiating the cleavage, as will be described below in more detail.

Considering a cylindrical ingot, KOH etching will only create sawtooth shaped notches at regions where the line of intersection of two (111) planes is tangent to the surface, and these only occur at intervals of 60° around the periphery. Cleavage initiated at such regions has a problem because cleavage might be initiated at the wrong (111) plane passing through the growing fracture edge. This problem is addressed in the present method, since the wrong plane is generally under compressive stress while the correct plane is under tensile stress. During the peeling process, discussed later, this problem might be addressed by initiating peeling from a point 30° offset from the notch region, to minimize the chance of unwanted fracture. A notch made initially with a diamond blade, on the other hand, might be optimally made in at this point 30° offset from the two points around the ingot when the intersection of two (111) planes is tangent to the ingot surface.

Figure 2:
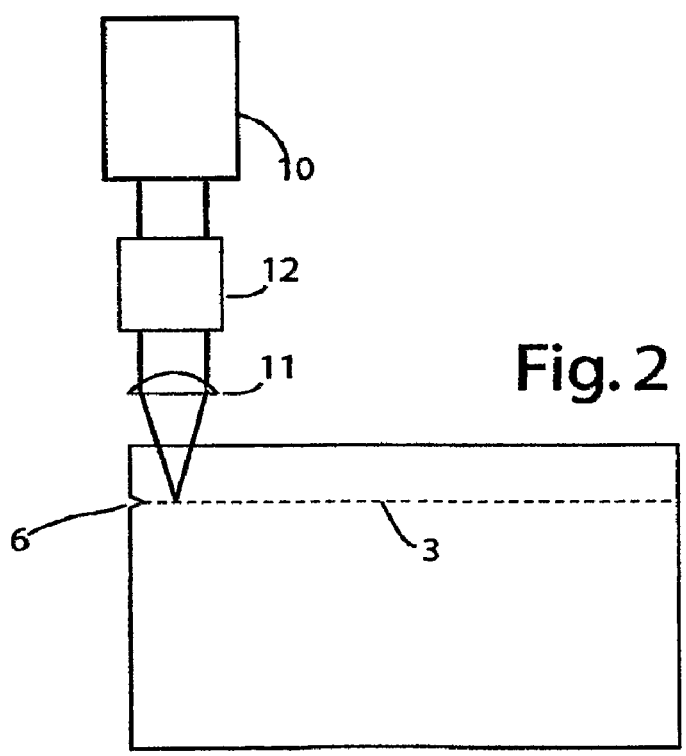
FIG. 2 is a schematic plan view of the invention showing the means to locally heat a volume of the ingot in a region of the plane of the desired cleavage.

FIG. 2 shows how a laser 10 is focused by cylindrical lens 11 to a volume in the interior of ingot 1, such that the volume is very elongated along an axis that is in the desired cleavage plane and is parallel to and a short distance from the sharp vertex of notch 6. An anamorphic beam expander 12 expands the output of laser 10 into a collimated beam with a long rectangular cross section to match the area of cylindrical lens 11. Though lens 11 is shown as a single element, it could be a compound lens. Lens 11 could also be circularly symmetrical, and adapted to focus a rapidly scanned point onto a line, and still other possibilities are discussed below.

Figure 3:
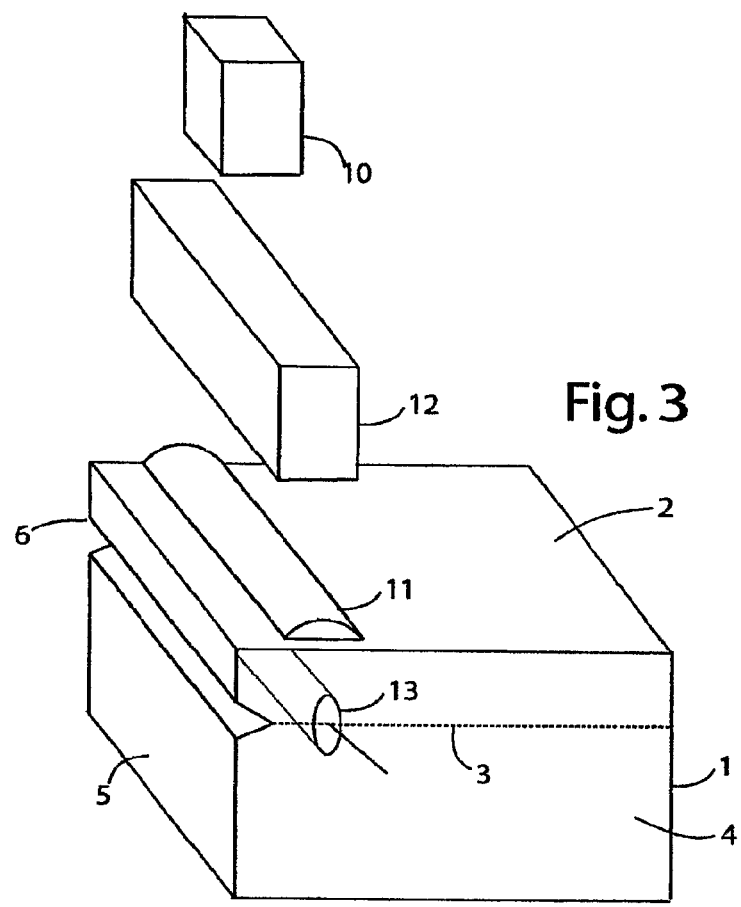
FIG. 3 is a three-dimensional view of the device shown in FIG. 2, adapted for a rectangular ingot with a notch in one side.

FIG. 3 shows in the device of FIG. 2 in three dimensions, and shows the illuminated volume 13 in the ingot. The illuminated volume 13 is approximately a cylinder with its axis in the desired cleavage plane and parallel to the vertex of notch 6. Generally, the cylinder is distorted to have an oval cross section with its width in the desired cleavage plane greater than in dimension parallel to the optical axis of lens 11. When the width of the illuminated volume is made as narrow as possible, given the limitations of the optics, this oval cross section results from the fact that the three dimensional point spread function has a greater width in the longitudinal than in the lateral dimension. In any case, the shape and position of the illuminated (and heated) volume 13 is chosen so that at the edge of the notch 6 or at the growing edge of the cleavage fracture extending from that notch edge, the stresses normal to the desired cleavage plane are tensile and they are maximal at the desired cleavage growth front.

Figure 4:
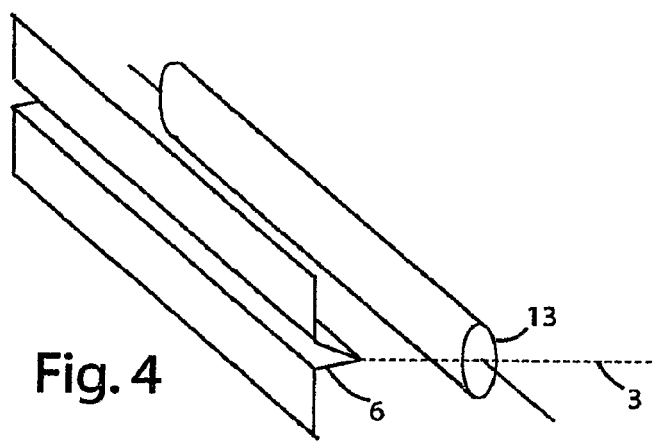
FIG. 4 is a detail of FIG. 3, showing the full width of the illuminated volume in relationship to the starting notch.

FIG. 4 is a detail from FIG. 3 showing the full length of illuminated volume 13. It should be understood that in FIG. 3 and the other drawings, the size of the notch 6 and the heated volume 13 are shown much larger in relationship to other illustrated elements than their actual size, since in most cases the diameter of volume 13 in the plane of cleavage would be no more than a few microns and would be just a few microns away from the vertex of notch 6, while the ingot width could be 10 cm or more.

Figure 5:
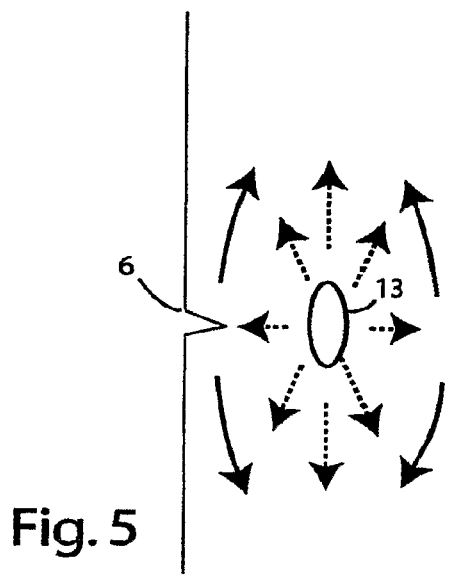
FIG. 5 is schematic cross sectional view of the elements shown in FIG. 4 showing stresses in the ingot produced by local heating in relationship to the starting notch.

A pulse of light from laser 10 heats the silicon in the illuminated volume 13 very rapidly, before there has been time for significant conduction of the heat away from the volume. In FIG. 5 the illuminated volume 13 is shown in cross section. On heating, the silicon in the volume 13 expands, creating radial compressive stress in the surrounding cooler silicon, shown by the dotted arrows in FIG. 5, and tangential tensile stress, shown by the curved solid arrows in FIG. 5. The vertex of notch 6 is subject to this tensile stress, normal to desired cleavage plane, and because of the notch, the stress is maximal near the vertex. The degree of heating is chosen so that the maximal stress near the vertex is just above the threshold for initiation of cleavage. Therefore a fracture is initiated at the vertex of notch 6 in the desired plane, but nowhere else. The fracture only can propagate a short distance, because the tensile stress gets smaller closer to the axis of the illuminated volume. After the initial heating caused by the laser pulse, the temperature in the silicon is allowed to equilibrate. The ingot and the focusing system are moved relative to each other so that the illuminated volume is a small distance further from the notch 6, but with its axis remaining in the desired cleavage plane, and a new laser pulse of light repeats the process to extend the fracture.

This process is repeated several more times until the length of the fracture extending from the notch is great enough so that the illuminated volume can be positioned between the notch and the far edge of the fracture. Now a laser pulse can still create tensile stress on the growing fracture, but the fracture propagates away from the illuminated volume rather than towards it, so there is no need for equilibration of temperature between successive pulses, and the cylinder can be moved steadily away from the notch, keeping a constant distance to the growing fracture end, until the far end of the ingot is reached, and the cleavage has extended over the entire area of the ingot, to completely sever the wafer. Although the growing edge of the cleavage fracture might be visualized by ultrasonic microscopy, for example, in practice there may be no need for such visualization. The optimum advance of the illuminated volume relative to the ingot on successive could be determined empirically, and such scanning would be preprogrammed, and implemented by a computer-controlled translator.

To produce defect-free cleaved surfaces with this process, it is critical to maintain a substantially pure tensile stress normal to the cleavage plane near the fracture end, and to stay below the threshold for new fracture initiation. Centering the heated volume on the cleavage plane to maintain symmetry with that plane facilitates this. To create such symmetry it is important that there be no significant absorption of the light traveling to the volume, but that the absorption be very efficient at the volume. These seemingly incompatible requirements are met by light in the wavelength range from around 1.2 to 3 µm, presented in pulses less than a few ns in duration in the short wavelength part of this range and less than a few hundred fs in the longer wavelength region of this range. This is because silicon is relatively transparent in this wavelength range, and only when the intensity becomes much greater, with short pulses and in the region of the beam focus, is the intensity great enough for two-photon or three-photon absorption, which depend on the square or the cube of the intensity, respectively. Therefore the light of lower intensity converging on the line focus would pass with relatively low absorption through the crystal, and only at the focus would the light be absorbed and converted into heat. (Xu and Denk, *J. Appl. Phys* 86:2226(99), Nejadmalayeri, et al., *Opt. Lett* 30:964 (05)).

In the short wavelength end of the 1.2 to 3 µm range, two-photon absorption predominates, and for wavelengths longer than about 2.2 µm, only three-photon absorption is possible. Each of these multiphoton absorption processes has certain advantages and disadvantages. Two-photon absorption does not require as high peak intensities, and can take advantage of the greater range of commercially available powerful short-pulsed lasers in the wavelength range between 1.2 to 2.2 µm. However, when the laser light is focused to a line, the intensity falls off inversely with just the first power of distance from the line focus, and combined with the quadratic dependence of two-photon absorption, the result does not provide very large discrimination between the focal plane and planes close to that plane. This problem is exacerbated because the high pulse powers needed for sufficient heating can lead to intensities able to trigger two-photon absorption at relatively large distances from the focal plane.

Three-photon absorption, between about 2.2 to 3 µm, places greater demands on the brevity of the laser pulses, which in combination with the pulse energy requirements severely limits the choice of available lasers. However three-photon absorption provides much better depth discrimination, and in particular it should work well even with the simple device shown in FIG. 3.

One commercially available laser source that should be suitable for three-photon absorption induced heating with the apparatus shown in FIG. 3 is the Spectra-Physics OPA-800C optical parametric amplifier pumped by a Spitfire amplified Ti-sapphire laser (Spectra-Physics, Mountain View, Calif.). This combination, referred to here simply as a "laser," could be tuned to 2.4 µm, as in the study of Nejadmalayeri, et al., *Opt. Lett* 30:964 (05). That study showed that the output pulses of that laser, focused to a point in the interior of a volume of silicon, are sufficient to raise the temperature at the focus to the high levels needed to produce a lasting refractive index change. In the present invention, when the beam is focused to a line segment, because the focal volume includes a larger mass of silicon, lower temperatures would be produced. Such lower temperatures hopefully would not produce any lasting change in physical properties, but would be sufficient to produce the local stresses sufficient to initiate and extend a cleavage fracture, as described in this specification. That laser also has a widely adjustable wavelength output, so the initial set-up could be used to collect data to help choose the best wavelength and other parameters to optimize the process for a production environment. With the configuration of FIG. 3, the output pulse energy of the OPA-800C/Spitfire laser at 2.4 µm should be sufficient to cleave at least narrow wafers.

Figure 6:
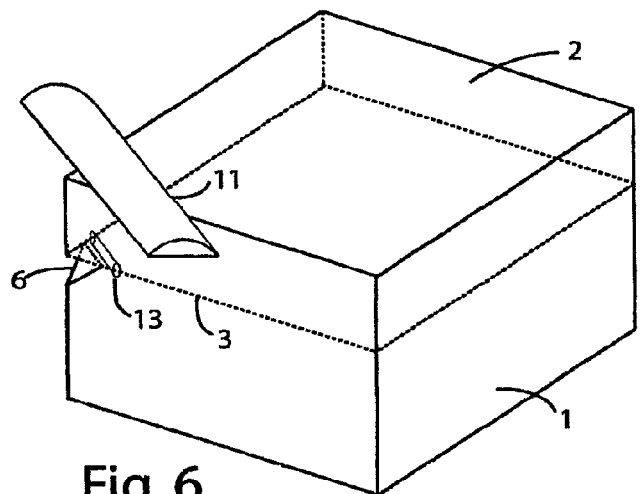
FIG. 6 is a three-dimensional view of the device shown in FIG. 2 adapted for a rectangular ingot with a notch in one edge.

An alternative, and potentially much more economical, source of the ultrashort pulses at the desired mid-IR wavelength are newly developed fiber based lasers (Sorokina et al IEEE Journal of Selected Topics in Quantum Electronics, 20 (5) 2014), With notch formation by methods such as chemical etching or ion milling discussed above, the vertex of the notch 6 would have a substantially larger radius of curvature than the atomic dimensions of the growing edge of a cleavage fracture, so higher stresses would be required to initiate cleavage at the notch vertex than to extend the growing cleavage edge. Consequently, lower maximum temperatures are required at illuminated volume 13 for cleavage extension than for cleavage initiation. This difference suggests a modification of the apparatus of FIG. 3, where the notch is on an intersection edge of a two flat areas ground into the side of an ingot, so that only a small length of the heated volume is required at the site of cleavage initiation. Such an arrangement is shown in FIG. 6, which is the same as the device shown in FIG. 3 except for the location of the notch at an edge, and the fact that anamorphic beam expander 12 (unillustrated) can be optionally moved out of the path of the laser beam. For cleavage initiation, the anamorphic beam expander 12 is moved out of the beam path, so the much narrower collimated output beam from laser 10 (unillustrated) is directly incident on lens 11, and consequently all the pulse energy is concentrated on a much shorter illuminated volume 13, of a length, say, on the order of a millimeter or less. (If necessary, even more concentrated illumination is possible by replacing the beam expander with a beam area reducer.)

After the cleavage fracture is started, the beam expander 12 is put back in the beam path, for the scan to the opposite edge of the ingot. Because the focused laser beam used for cleavage extension can be of lower peak power per unit length of the illuminated volume than for the device of FIG. 3, the illuminated volume 13 can be longer for a given laser pulse energy, and thus wider wafers can be produced than can be produced by the device of FIG. 3.

Figure 7:
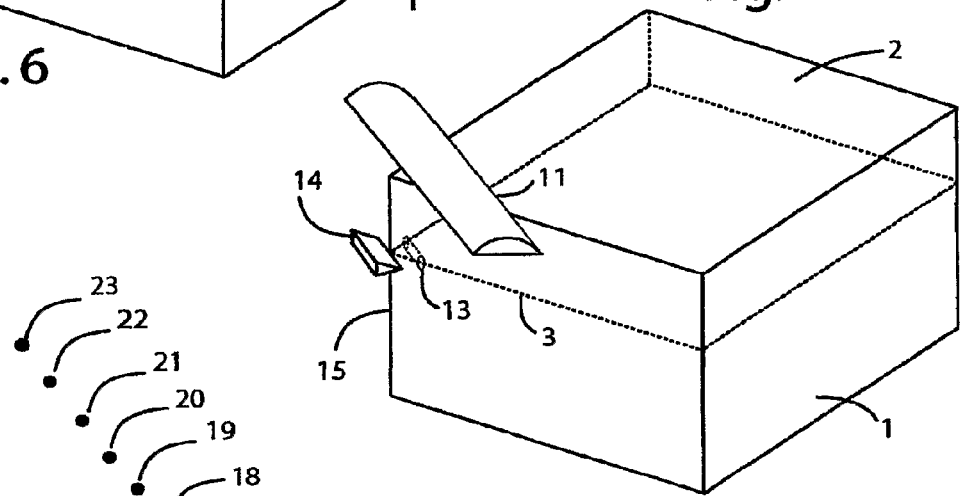
FIG. 7 is a three-dimensional view of the device shown in FIG. 2, adapted for a producing a notch in an edge of a rectangular ingot at the time of cleavage.

The device of FIG. 7 shows a variant of the device of FIG. 6, where the notch is made at the time of cleavage by an extremely sharp diamond blade 14, which is placed in contact with an edge 15 of ingot 1. Because the edge of the blade 14 can be aligned so it is in the plane of the focal volume 13, there is no need for a step, required in the apparatus shown in FIG. 3 and FIG. 6, to insure that the vertex of notch 6 is in the focal plane of illuminated volume 13. Additionally, there is no need to process the ingot by production of the notches such as notch 6 prior to the cleaving step. Finally, by applying a force to blade 14 while the silicon it is contact with is under maximum tensile stress, the likelihood of initiating cleavage at the intended location is greater than in the devices of FIG. 3 and FIG. 6, when the tensile stresses simply encounter a notch 6 that concentrates them into the region of the desired cleavage initiation.

With such an embodiment of the present invention, it may be desirable to make the edge 15 particularly free of microcracks that could initiate unwanted cleavage in respond to transient heating. Therefore it may be useful to expose edge 15 to chemical etching and polishing to remove the outer silicon layers along with any surface damage due to cutting and grinding, prior to beginning the cleaving procedure. It may also be useful to apply a protective coating to the edge 15 to reduce the chances of new cracks forming during handling of the ingot.

The requirement of synchrony between the laser pulse and force on blade 14 could be met by the transient local expansion of the silicon in response to the laser pulse, or it could be provided by a piezoelectric actuator translating blade 14 in response to an electric pulse timed to be in synchrony with the laser pulse. As an alternative synchronization means, the output of laser 10 might be divided into two paths, one of which is focused on the illuminated volume 13 and the other of which is directed onto a light-to-mechanical force transducing element, such as a small vane that converts the momentum of the optical pulse into a mechanical impulse, thereby transiently increasing the force between the blade 14 and the ingot. In case the static force between the blade and the ingot prior to the light pulse is too low to produce any lasting deformation, the first microcrack created in response to the light pulse would become a starting notch, which would then seed further extension of the cleavage. Because of its simplicity and because it can be quickly constructed, the embodiment of the present invention shown in FIG. 7 is the preferred form of the present invention, at least initially.

For cleaving still wider wafers, the pulse energy output of the OPA-800C/Spitfire could be increased, for example by increasing the power of the pumping laser. Alternatively, a more powerful laser could be substituted. Another alternative is to focus the laser output onto a short line segment which would be scanned in two dimensions over the desired cleavage plane. To avoid the mismatches of cleavage planes that can result when two cleavage fronts intersect, patterns for this two dimensional scan should always extend the cleavage from an existing cleaved region, should always require the minimum scan movement between two successive light pulses and should avoid the possibility of one cleaved region extending into a preexisting cleaved region. One example of pattern meeting these criteria (thinking of an ingot that has been machined to a rectangular cross section) would be to form notch 6 in one edge of the ingot, then extend the cleavage from that notch to form a small triangular cleaved region at an edge of the ingot. Then starting from that edge, the illuminated line segment is scanned along one of the ingot sides to produce a cleaved margin adjacent to that side, and finally, beginning in that margin, starting from one side of the ingot, the scanning is in parallel rows, perpendicular to the side with the cleaved margin, like mowing a rectangular lawn in strips, until the entire ingot is cleaved. It should be appreciated that with such a scheme, the wafer diameter size is limited only by the diameter of the ingot, and wafers could be produced with dimensions far greater than would be practical with wire sliced ingots. Ribbon based wafer production methods intrinsically have the ability to produce large dimensions in the length dimension, but the present method would allow large dimensions in width as well. Such large wafers improve power conversion efficiency by reducing edge effects, and they also reduce module assembly costs.

Figure 8:
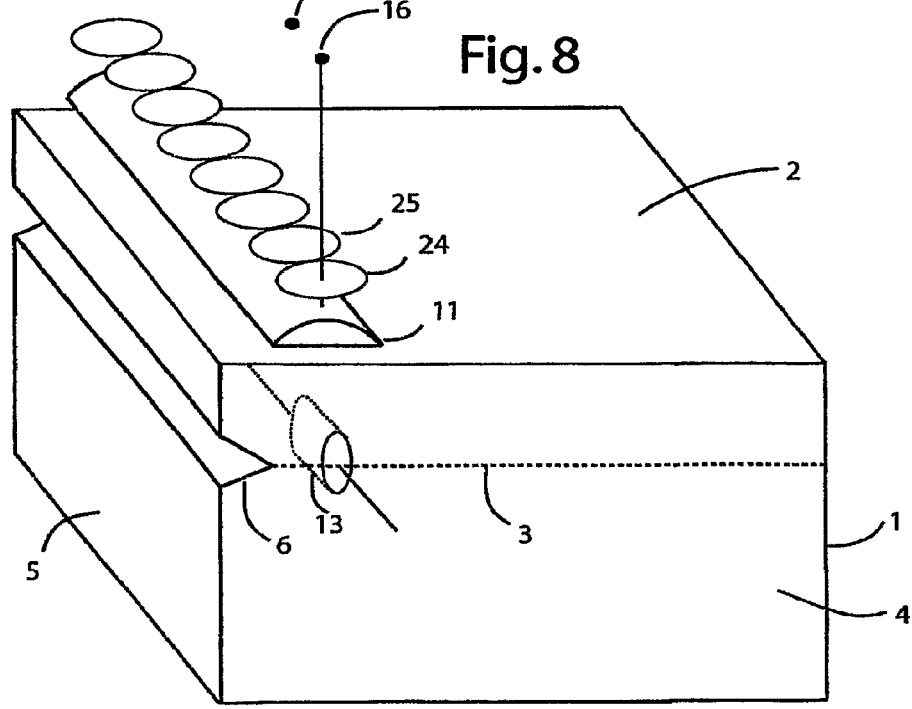
FIG. 8 is a three-dimensional view showing a system for sequentially directing the heating laser to successive segments along the heated volume.

The scanning time in such a two-dimensional scanning scheme could be reduced considerably if scanning in the direction parallel to the growing cleavage fracture edge did not require relative movement between the lens 11 and the ingot surface. This would be possible if such scanning were performed with a continuously rotating polygon mirror or a galvanometer-operated plane mirror scanner, as shown in the apparatus of FIG. 8. Successive output pulses of the laser 10 (unillustrated) are focused in succession on collinear points 16 through 23, by a one-dimensional mirror scanner (also unillustrated). The art of such mirror scanning such that the scanned points are coplanar, is well know, for example for laser printers, and will not be described further here, except to say that the optics would have to be compatible with the mid-infrared light. Light diverging from point 16 is directed to lens 24, which collimates it, and directs the collimated beam to one of the end portions of cylindrical lens 11, which then focuses the light to a line segment, heating up a volume of the silicon shown by region 13. The next pulse is focused on point 17, and the light is collimated by lens 25 and focused in the silicon ingot to heat a volume adjacent to region 13, and so on until the last region along the illuminated volume is heated. By making the light leaving lenses such as 24 and 25 slightly divergent, the heated volumes will slightly overlap at their ends.

As mentioned above, two-photon absorption of light from about 1.1 to 2.1 μm has advantages over three-photon absorption in that it places less stringent requirements on the brevity of the pulses, to insure adequate instantaneous intensities. Furthermore, relatively inexpensive lasers are available in that wavelength range with sufficient power per pulse to allow rapid scanning for high throughput. One problem, however, is that the two-photon absorption of silicon is great enough so that at the intensities needed to deliver sufficient energy to the focal plane to induce cleavage, in a short enough time interval to prevent dissipation of the thermal gradients, there can be substantial two-photon absorption outside of the focal region. A second problem is that when light is focused to a line, the fall off of intensity from the focal plane follows a $1/r$ law, as opposed to the $1/r^2$ law for light focused to a point. These two factors in combination can make it difficult to get the ideal pattern of tensile stresses normal to the cleavage plane, at the cleavage front. A possible solution to the first problem is to choose a wavelength near the long wavelength cutoff for two-photon absorption, where absorption is relatively inefficient compared to the wavelengths of maximum absorption, but at high intensities, still sufficient to fully absorb the incident light within the focal region.

Figure 9:
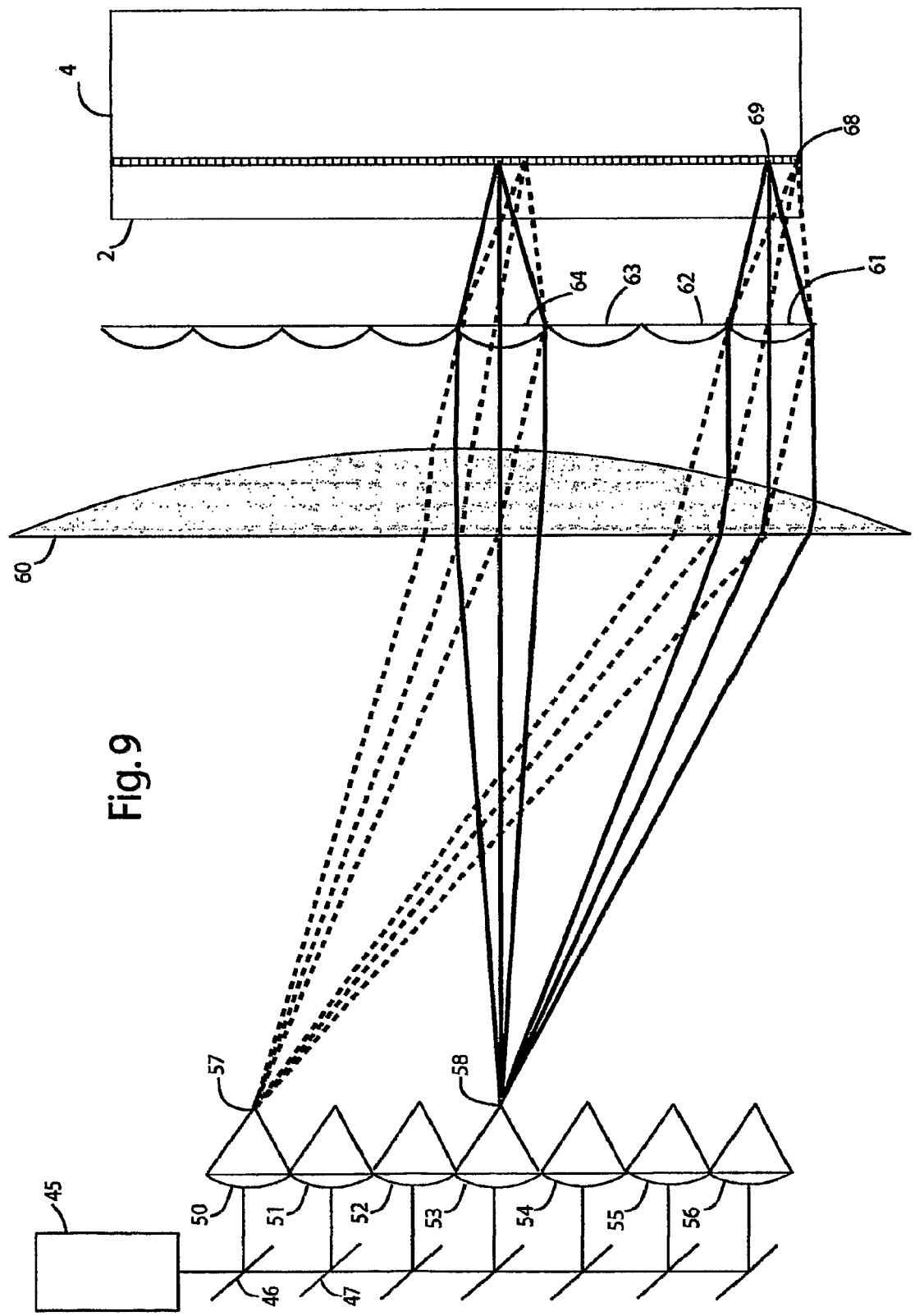
FIG. 9 shows a technique for creating a focused line of light, but where near the focus, the intensity effectively falls off inversely with the square of the distance from the focus.

FIG. 9 illustrates a method that addresses to the problem of $1/r$ falloff of intensity by ensuring that the light focused on the illuminated line, in the vicinity of the line, will decrease in intensity inversely proportional to the square of the distance from the line. Light from laser 45 successively passes through a series of beam splitters, the first two of which are beam splitter 46 and 47, so that the power of the beam leaving from laser 45 is reflected into sub-beams of equal intensity, directed at a series of lenses 50 to 56. The sub-beam reaching lens 51 is delayed with respect to the sub-beam reaching lens 50 because of the added path length from the laser to beam splitter 47 compared to the path length to beam splitter 46. Similarly the delay increases with each beam splitter. The collimated laser light is focused by lens 50 to point 57, and the light diverging from point 57 is recollimated by lens 60 to be incident on the lens array, including lenses 61, 62, 63, 64 plus four unlabeled lenses. Light originally passing through lens 50, and now refocused by lens 61, passes through the surface 2 of ingot 4 to produces an image of point 57 at one spot 68 of the illuminated line in ingot 4.

Light passing through lens 51 is similarly focused to a spot on the illuminated line in the ingot 4 adjacent to spot 68. Because of the delay in the light reaching lens 51 compared to the light reaching lens 50, the light reaching spot 68 at the end of the illuminated line never overlaps in ingot 4 with the light reaching the point adjacent to spot 68. Similarly, for example, light from lens 53, focused to spot 58 and then refocused to point 69, does overlap in ingot 4 with the light focused on endpoint 68 or any of the intervening points. Lens 62 images light from lens 50 to a spot on the illuminated line adjacent to the light from lens 56 imaged by lens 61, and thus the pattern repeats. In this way, spots that are separated by six non-illuminated spots are illuminated simultaneously. Close to the illuminated line, the cone of light focused on any point on the illuminated line does not overlap any other such cone, so in that range, the intensity falls off inversely with the square of the distance from the line. At greater distances from the line, the instantaneous intensity is never greater than $1/7$ of the intensity that would be necessary to create such a line with synchronous illumination. Therefore with two or three-photon absorption, the absorption at greater distances from the line is no more than $1/49$ or $1/343$, respectively, of the absorption if the line were illuminated synchronously.

In case the light for the device of FIG. 9 is generated by laser diodes, then it may be desirable to have a separate laser diode for each of the lenses 50 through 56, with delays between the output pulses of the lasers long enough to avoid overlap near the illuminated line. Alternatively, instead of delay caused by propagation in air, the output of a single laser could be coupled into a plurality of fibers of differing lengths, to produce the required delays between pulses. In the device illustrated in FIG. 9 the number of spots focused on the illuminated line is equal to the number of lenses in the lens array including lens 50 multiplied the array including lens 61 could include any number of lenses, so that the number of spots in the illuminated line could be increased by increasing the number of lenses in either array.

In all the embodiments of the present invention described thus far, the same laser produces cleavage initiation and extension, however there may be advantages to using different lasers perform these roles. For initiation, a laser in the three-photon absorption band would be used to more precisely control the location of the stresses. When such initiation begins at an edge of the ingot, when the length of the heated volume is short, then relatively low peak pulse energy is sufficient. However for cleavage extension, precision of the stress location becomes less important, since the preexisting cleavage serves as a guide to further cleavage, but beam power becomes more important because (with an embodiment as in FIG. 6) the heated volume is longer and the more powerful beams allow faster scanning over the entire wafer. For this extension phase, a laser in the long wavelength edge of the two-photon absorption band may be optimal. Thulium doped fiber lasers up to 150 W continuous wave output are now commercially available (IPG Photonics Corp. Oxford, Mass.) over the long wavelength cutoff end of the two photon absorption spectrum of Si, which as discussed above, may be a good choice for the present application. Such a laser, in a mode-locked or amplified mode-locked configuration, linked by optical fibers to a cluster of say 20 separate cleaving workstations, would be probably have sufficient power to drive the entire cluster, at high cleavage extension velocities.

For the cleavage initiation phase, lens 11 might be a conventional Schwarzschild-type reflective objective, imaging an illuminated slit (or line focus of a collimated beam produced by a cylindrical lens) into volume 13 in the ingot, while the cylindrical lens 11 illustrated in FIGS. 6 and 7 for example, would be used for cleavage extension.

For cleavage initiation, it may be advantageous to image a line of light on volume 13 at a distance from the axis of lens 11, to put it closer to edge 15 than would be practical if the volume were on the axis of lens 11. Such off-axis imaging introduces possible aberrations, which must be addressed. However it allows a larger effective numerical aperture, which can produce greater resolution than would be possible if the entire lens 11 were moved closer to the edge of the ingot to provide on-axis imaging.

One way to share a laser adapted for cleavage initiation and a second laser adapted for cleavage extension, is to use a set-up with just the first laser to create multiple cleavage initiation sites in parallel layers on an ingot then move the ingot to a set-up with the second laser, where the already initiated cleavage fractures are elongated and the wafers detached. FIG. 10 shows apparatus, specialized for just the cleavage initiation part of the process, specifically to create a set of parallel short cleavage fractures on edge 15 of ingot 1, such that each of these cracks can serve as a starting notch for a successive cleaved wafer. Lens 70, which may be made of silicon or another infrared transmitting material with a refractive index similar to silicon, has a spherically ground side, and on the side opposite the spherically ground side it has a V-shaped notch, of the same angle as the angle as the intersection of the two sides at edge 15. Therefore, when the notch in lens 70 rests against the ingot 1, the sides of the notch fit tightly against the two sides of the ingot. An immersion fluid of the same index of refraction as silicon, between the notch of lens 70 and the ingot, may insure good optical coupling of the lens to the interior of the ingot. A rectangular slot 71 in lens 70 through the center of the spherically ground surface, has sides normal to edge 15, and the bottom 72 of the slot is deep enough so that edge 15 protrudes within the slot 71, though this protrusion is not visible in FIG. 10. An extremely sharp diamond blade 14 (unillustrated) that occupies slot 71 has the same relationship to edge 15 as in FIG. 7, so that the sharp edge of the blade is perpendicular to edge 15. Lens 70 images a slit shaped source of light of an intensity and wavelength able to be absorbed at the focus by three-photon absorption to an illuminated volume (unillustrated) of similar shape to volume 13 of FIG. 7. By changing the position of the slit shaped source imaged on an illuminated volume with successive laser flashes, the volume can be moved progressively farther away from the lens 70, so the resulting cleavage can be not only formed just adjacent to edge 15, but it can be extended a small way into the interior of the ingot, to more effectively serve as a seed for further extension of the cleavage across the ingot in later processing. FIG. 11 shows the ingot 1 after processing by the apparatus in FIG. 10. Three initiating cleavages are shown as triangles adjacent to edge 15, though with a more likely wafer thickness, say in the range of 50 µm, there would be 2,000 such triangles per 10 cm length of ingot.

The OPA-800C/Spitfire laser commonly has a 1 kHz pulse output frequency, and making the assumption that each pulse can extend the cleavage about 5 µm, the growing edge could only advance at about 5 mm/second, which may appear not nearly fast enough for a commercially viable wafer cleaving operation, especially in view of the high cost of the laser. However it should be remembered that this expensive laser would be required only at the initiating region of the cleavage, and this region need extend only, say, 100 µm beyond the edge 15, so only 20 pulses together taking 20 ms would be required to initiate the cleavage per wafer. With an efficient scheme to move from one cleavage site to the next along the ingot, and to put new ingots in place once the initiation notches are made in the last ingot, and with around-the-clock operation of the laser, in a year, a single such laser could initiate cleavages for 1,576,800,000 wafers.

So that the time for movement of lens 70 from one cleavage site to the next does not slow down the rate of notch productions, two of the devices of FIG. 10 could be used in tandem, with a routing switch between the laser and the two devices, so 20 pulses from the laser first went to one of the devices to produce the first cleavage initiation, then the pulses are immediately routed to the second device while the lens 70 on the first device is moved to the next cleavage site, etc. If more time for translation of the lenses is required, more devices could be added, and the laser output routed in sequence through the set of devices.

Ingots processed with such initiating cleavages could be transported away from a central production facility for final cleavage extension, wafer separation and processing into cells, or the process could be done in a different area of the same production facility.

Once a new wafer is completely cleaved from its parent ingot by the method of the present invention, the wafer and ingot are still bound by van der Waals forces, and additionally are compressed by ambient air pressure, or more specifically the viscosity of the air that must enter the widening crack between the ingot and the new wafer will slow down the separation process. The adhesion of the new wafer to the parent ingot is magnified by the precision of the cleavage process, resulting in two perfect crystal faces in close apposition, and exactly aligned atom by atom. However a variety of methods are available to help separate them. Reducing the atmospheric pressure, and/or replacing the air with a less viscous gas like hydrogen, could help alleviate the effect of atmospheric pressure. A pulse of ultrasonic energy transmitted from the end of the ingot opposite the new wafer, could lead to mechanical dislocation and heat formation at the interface layer, and the thermal gradients induced in the new wafer would produce an arching effect that could help the separation process. Applying a high voltage to the ingot could induce electrostatic repulsion of the outer layer. The ingot (or more practically, a thick ingot slab) could be spun in a centrifuge with several similar ingot slabs to apply centrifugal force to the new wafers. Or jets of low density, high velocity gas could be directed to the notch at the side of the ingot, to apply a separation force. Various combinations of these and other methods would probably be more effective than any method by itself.

FIGS. 12A, 12B and 12C illustrate a method of peeling the cleaved wafer from the rest of the ingot 1. An element 80 with a cylindrical curvature (exaggerated in the drawing) is put in contact with one side 2 of the newly formed wafer, so the cylindrical surface is tangent to the wafer surface. Some sort of adhesion is provided at this contact point, for example by vacuum suction, in case the peeling process is done at atmospheric pressure, or perhaps a thermally activated adhesive, or even by a finger mechanical element that engages with notch 6. It is even possible to use water or another liquid at the contact point, which would be frozen to promote adhesion. Once adhesion is achieved, element 80 is rolled over the surface of the ingot, as shown in FIGS. 12B and 12C, such that the newly formed wafer remains in contact with the element 80.

In case peeling of the new wafer away from the ingot is done in a vacuum, then several subsequent processing steps to make solar cells could be done in the same vacuum environment, to reduce fabrication costs. These operations include creating selective areas of doping, creating a passivation and antireflection layers and creating metal contacts. The vacuum chamber could be adapted to cleave multiple wafers from the same ingot, to perform initial processing on them, finally to collect the partially processed wafers in a storage compartment, before the vacuum is released, or before the compartment is removed through an airlock.

In such a process, the ingot placed into the vacuum chamber could have many parallel notches on ingot edge 15, as would be produced by the apparatus in FIG. 10. In that way, the process of cleaving and peeling could be repeated, each time beginning with the next lower notch. So the separation between notches can be larger than the wafer thickness, the ingot could be ground to have several edges like edge 15 around the periphery, and successive notches could be on successive edges around the ingot.

In the special case of production of solar cells where all the electrical connections are from the backside, a transparent stiffening member compatible with focusing the light from laser 10 to a focus within the ingot, could be applied to face 2 prior to the cleavage process. A very thin wafer could thereby be made, with a reduced risk of fracture on removal.

In the special case of production of solar cells where all the electrical connections are from the backside, a transparent stiffening member compatible with focusing the light from laser 10 to a focus within the ingot, could be applied to face 2 prior to the cleavage process. A very thin wafer could thereby be made, with a reduced risk of fracture on removal.

For transporting the wafers through a cell processing line, each wafer may be held by a miniaturized vacuum holder, perhaps less than 1 cm thick and the holder would travel through the line along with the wafer. Since the holders would allow only access to one side of the wafer, there could be a reversing operation, where the wafer was lifted from the holder, reversed, and then placed back with the other side up. The vacuum in the holder might be regenerated by connection to a vacuum system, at various locations along the production line, or it could even be maintained by a extremely miniaturized vacuum pump contained within each holder.

Another method to reduce fracture of very thin wafers, both during peeling from the ingot and during subsequent processing, would be to use a high temperature and low outgassing adhesive tape to tape the wafer to a frame, also made of a material that could withstand the temperatures and chemical treatments encountered in cell processing. One possibly suitable tape would be a high temperature and low outgassing polyimide tape with an acrylic adhesive, for example labeling tape sold, for example, by Polyonics, Inc., Westmoreland, N.H. 03467. The wafer, tape and frame, would be moved as a unit thorough the various processing steps. Because the tape would be mask the underlying regions of the wafer from possibly beneficial treatments, perhaps chemical additives could be added to allow, in conjunction with subsequent heating, any necessary passivation or doping in such masked regions.

The tape also could help facilitate the peeling of the wafer from the ingot. FIG. 13A shows a length of such tape 90, adhering to one edge of a cleaved wafer still in place on its parent ingot 1. One side of the tape 90 is tapered to a low thickness to reduce local strain on the wafer. The tape could be used in conjunction with a method illustrated in FIG. 12, for example when convex surface of element 80 in FIG. 12A is in contact with one side of the wafer, some means could be provided to bind the cylinder to the tape, so that as element 80 was rolled, it would pull the tape away from the ingot, thereby freeing the adhering wafer. FIG. 13B shows the frame 91, connected with both the tape 90 and the wafer. Binding of element 80 to tape 90 could be by a mechanical finger (unillustrated) from element 80 that engages one side of frame 91, while the frame adheres to tape 90.

FIG. 13C shows in a three-dimensional view and FIG. 14 in a cross sectional view, the completed peeled-away wafer mounted in the frame 91 by tape 90 and a second strip of tape 92 on the opposite edge of the wafer. Tape piece 91 could be adhered to the wafer while it was still on the ingot, but only affixed to the frame after peeling is completed. A small tension in the wafer, below the threshold for damage to the wafer, would help keep the wafer taut in the frame, and provide a flat surface for processing.

Figure 15:
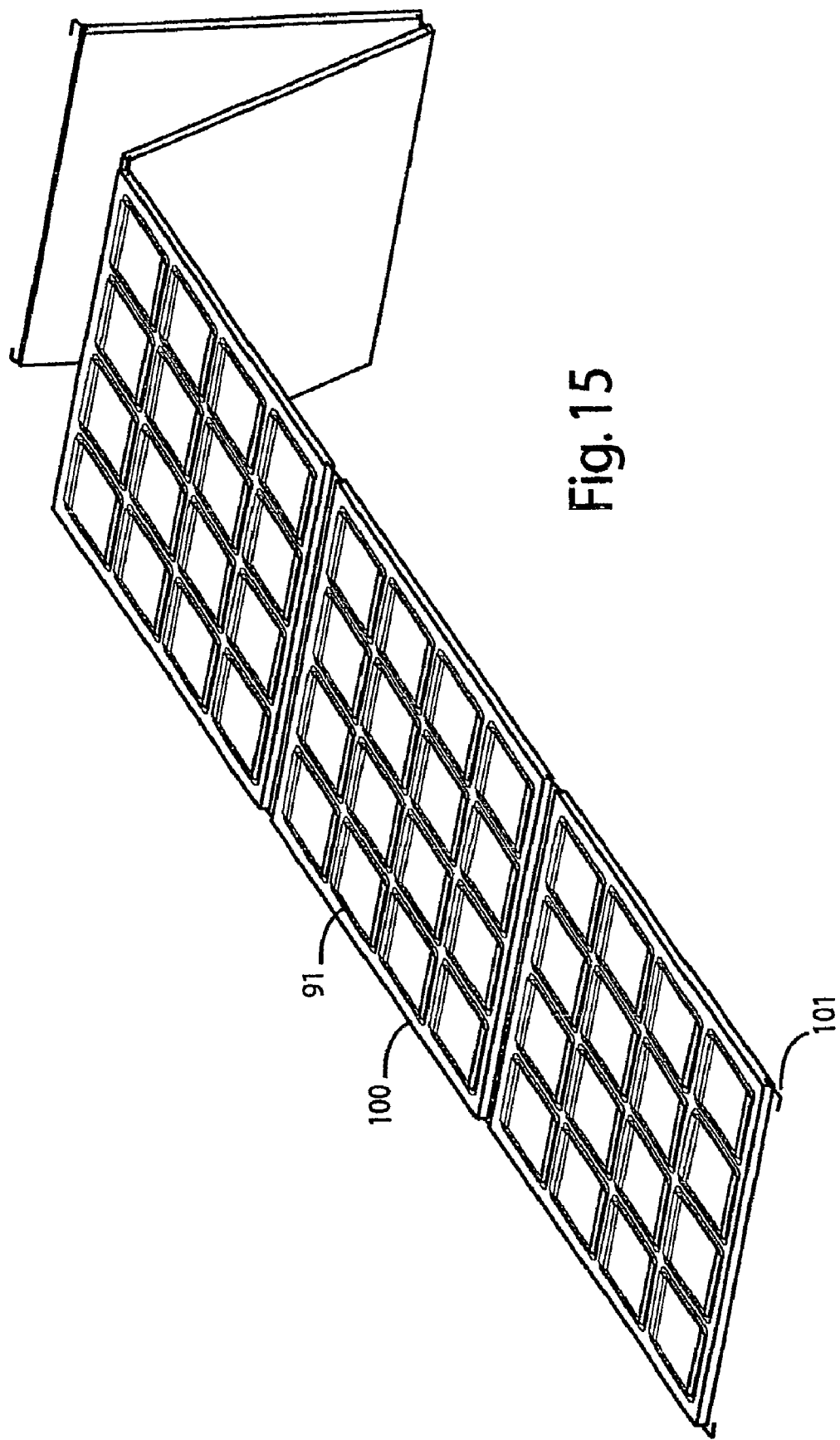
FIG. 15 is a three-dimensional view showing how wafers supported in frames can be carried in super-frames, linked together to pass through a cell processing line.

The wafers in their attached frames might be processed in a conventional solar cell processing assembly line, provided that contact processes like screen printing were replaced by non-contact processes such as inkjet printing to reduce stresses on the wafer. However, as illustrated in FIG. 15, in a possibly advantageous alternative type of processing, the frames (e.g., frame 90) would be inserted into "super-frames" (e.g., super-frame 100) that resemble multipane windows, with the individual frames such as frame 90 analogous to small panes in such windows.

The super-frames might be flexibly linked by coupling elements (e.g., coupling element 101) to form a chain of super-frames that allows the super-frames to lie flat in a row, or to fold in a fan-fold configuration. Such a chain could carry the frames and mounted wafers through all the wafer processing steps, including the final cell testing and grading operations, without requiring any manipulation of the wafer itself. Cell processing based on such chains would have all of the cost and throughput benefits of roll to roll processing employed in certain thin film photovoltaic production schemes, while the ability to go into the compact fan-fold configuration would confer the additional flexibility to allow a large number of wafers to be maintained in a small space, for example for a slow vapor diffusion or temperature annealing operation, without requiring excessive lengths of the production line.

The tape might include a conductive strip, which would be connected with conductive strips formed on the wafer, and would allow interconnection between cells without risking fracture of the delicate silicon wafer. Alternatively, if it were not possible to find a tape material able to provide sufficient adhesion, temperature and chemical resistance at a low enough cost to remain in the finished module, the portion of the wafer adhering to the tape could be severed from the rest of the wafer by a cutting laser, and the silicon chemically dissolved so the tape could be recycled.

It may also be possible to combine the idea of an individualized miniature vacuum holder with the idea of the fan-folding super-frame, where the vacuum holders were mounted within the individual frame slots of such a chain of super-frames.

In case the intended cleavage plane contains a hard inclusion, for example a silicon oxide precipitate, this could prevent the successful completion of the cleavage. In the case of an aborted cleavage due to such an inclusion, it might be necessary to remove the ingot from the cleaving apparatus for grinding out the layers containing the inclusion, and such a process would add expense to the process. There are several possible solutions to this problem.

The simplest solution is to use a type of silicon ingot that has a very low concentration of inclusions, for example, float zone grown silicon. This could add cost to the finished cell, but would be more than made up for by the fact that less silicon is required than in current sawed single crystal silicon technologies.

A second possible solution is to saw the initial ingot into, say, 1 cm thick slabs, and to remove the slab from the cleaving apparatus after each cleaving. Both the top and bottom surfaces of the slab could be cleaved, in preparation for peeling, before the slab is removed, for greater throughput. With such a system, a fairly high likelihood of failed separation could be tolerated, without substantially adding to the total cost of the process.

Finally, it may be possible to use confocal reflected infrared light microscopy to inspect each prospective cleavage plane for inclusions before beginning the cleavage process. If an inclusion were found in the plane, then the next prospective plane below that would be so inspected, and if that were found to be free of inclusions, the wafer would be cleaved of twice the usual thickness (but still thinner than presently used in single crystal solar cells). If both planes were found to contain inclusions, then the ingot or slab would be removed for grinding and polishing.

Figure 16:
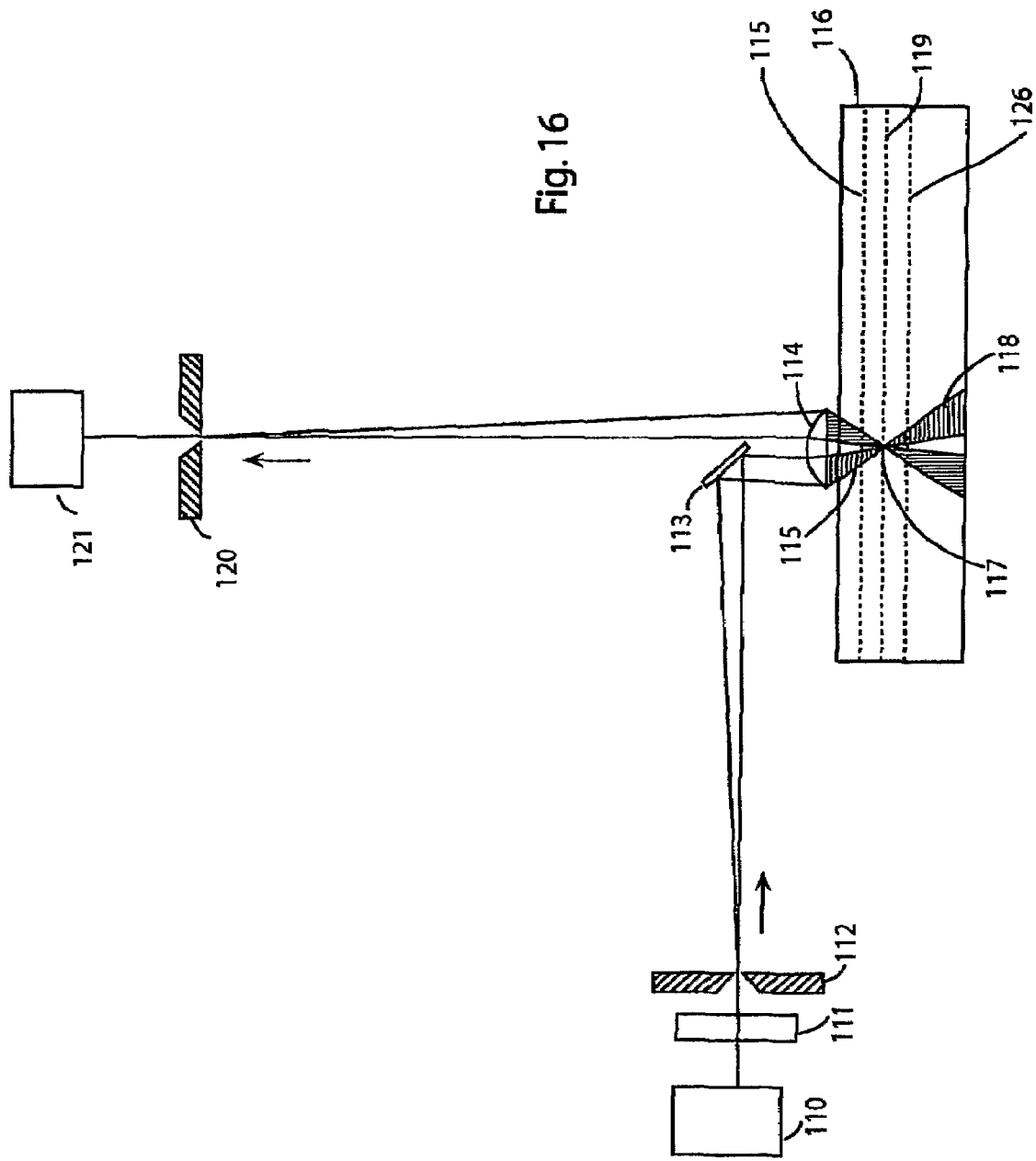
FIG. 16 is a schematic cross sectional view showing how a prospective plane for cleaving can be optically examined for inclusions before beginning of the cleavage operation.

Although many microscopic techniques are capable of using reflected light to detect scattering particles in a homogeneous medium, the example used here is a variation of the technique of focal plane specific illumination by means of "disjoint ray envelopes" described in Baer, U.S. Pat. No. 3,547,512, the disclosure of which is incorporated herein by reference. As shown in FIG. 16, light of a wavelength in the transparent region of silicon, for example around 1.5 µm, from laser 110, which may be a diode laser, is formed into a slit shaped focus by anamorphic beam expander 111 and focused onto slit 112, shown in cross-section. Light passing through slit 112 is directed to fully reflecting mirror 113 so as to pass substantially through one side of cylindrical lens 114, shown in cross-section. The light directed onto lens 114 is made to pass through a blade-shaped region 115 of the crystal 116 to converge to line 117, which is the real image of slit 112. The light then diverges from line 117 to illuminate another blade-shaped region 118. Light reflected from a scattering inclusion particle lying on line 116 can be focused by cylindrical lens 114 to reach slit 120 (which is conjugate to slit 112 relative to mirror 113 to reach light detector 121. However a scattering particle in illuminated region 115 above line 117 or in illuminated region 118 below line 117 will be focused by lens 114 to opaque parts of slit aperture 120 so cannot reach detector 121. Line 117 is scanned laterally with respect to crystal 116 (maintaining the geometric interrelationship between slits 112 and 120, mirror 113 and lens 114), so that at some time, every scattering particle in plane 119 can reflect light to detector 121. No scattering particle above or below plane 119 is ever simultaneously in a region illuminated by laser 110 and thus able to send light through slit 120 to detector 121. The result is that the system can only detect scattering particles in plane 119. The detection of a transient elevation of light by detector 121 during the scan indicates that there is a scattering particle in plane 119, so another plane should be chosen for cleavage.

The one-dimensional scanning movement of line 117 with respect to the crystal is the same as the scanning movement required for cleavage (at the intended cleavage plane 125) by method of the present invention. Therefore, if the laser apparatus for cleaving and that for inspection form a rigid assembly that is scanned in one dimension with respect to the ingot, then both operations can be performed with a single scan movement. Additionally, the presumptive cleavage plane below plane 119 (labeled plane 126 in FIG. 16) could be simultaneously examined during this movement, by including duplicates of elements 110, 111, 112 113, 114, 120 and 121 adjusted to image this plane 126. In that way, if plane 119 is shown unsuitable for cleavage, it will be immediately known if plane 126 can serve as an alternative.

In the plane inspection method just described, the sides of the ingot may produce a strong back-reflecting signal which could overwhelm a weaker signal from scattering particles in the plane. This problem could be eliminated by using moveable vanes to mask light from passing through slit 120, specifically in the portions of that slit where the image of the edge of the ingot is imaged.

The above apparatus for detecting inclusions will not say where in any particular line the inclusion is, only that it is somewhere in the line. However by replacing the detector 121 with a scanned one-dimensional detector array, such as sold by Sensors Unlimited, Inc., Princeton, N.J., it will be possible to create an image of the presumptive cleavage plane showing the location of inclusions within the plane. Then it may be possible to use that information to excise the individual inclusions by a local milling operation similar to a dentist drilling out a decayed part of a tooth. The result would be a wafer with one or more very small holes, which should not substantially reduce photovoltaic conversion efficiency nor increase wafer brittleness, provided the edges of the holes were suitably polished.

Figure 17:
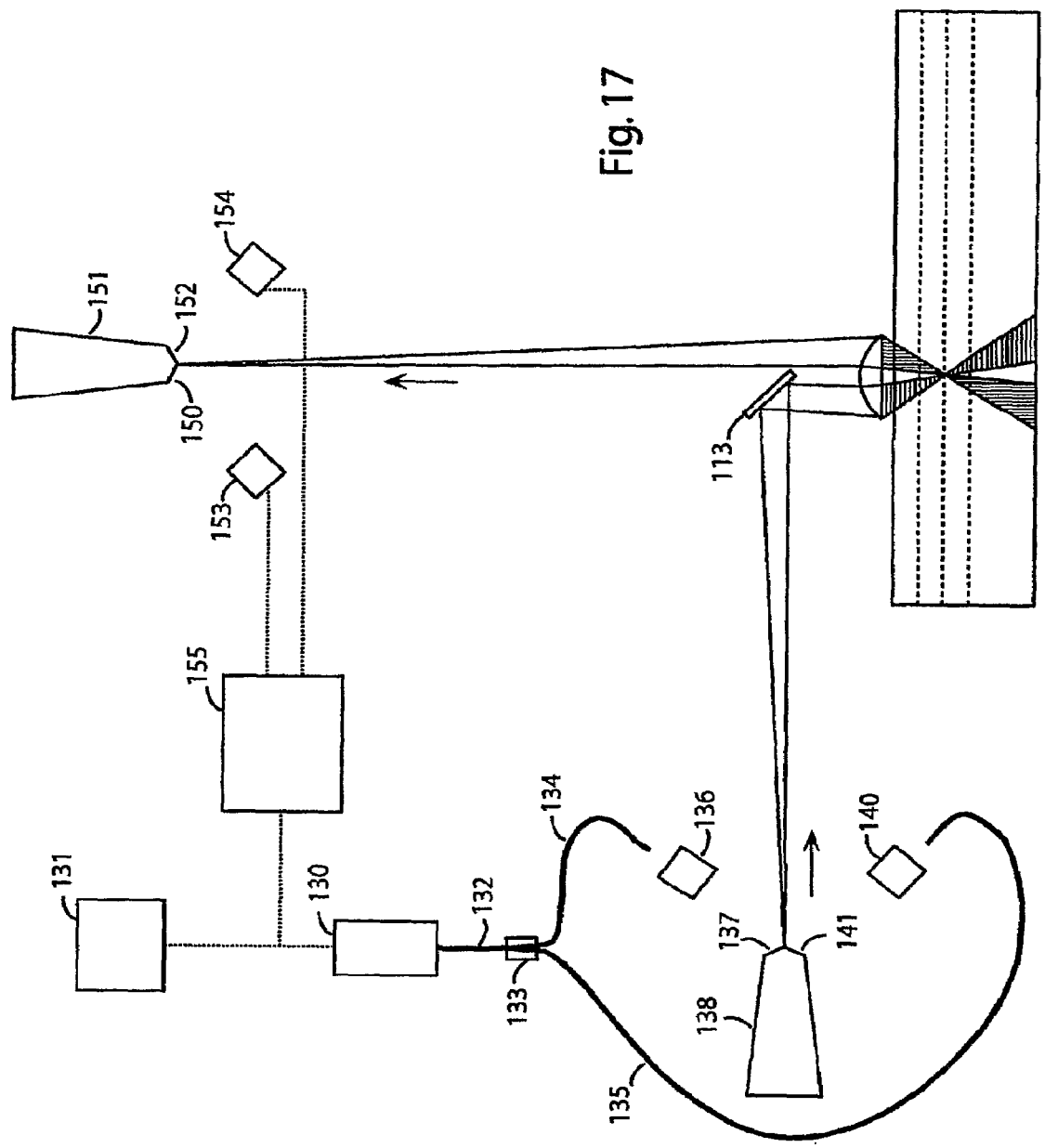
FIG. 17 is a schematic cross sectional view showing apparatus for increasing the sensitivity of detection of inclusions compared to the apparatus shown in FIG. 16.

FIG. 17 illustrates a variation of the apparatus shown in FIG. 16 to provide a greater sensitivity to detect inclusions. Pulsed diode laser 130 is driven by driver 131 to produce, for example, a 1 ns pulse of 1.5 .mu.m light every 4 ns. The laser 130 is coupled to output fiber 132, which is split by splitter 133 into a shorter fiber 134 and a longer fiber 135, the difference in the lengths of the fibers causing a delay of the pulse by 2 ns in the longer fiber relative to the shorter fiber. The output of fiber 134 is directed by anamorphic beam expander 136 to a line shaped pattern that is projected on the long slender reflective face 137 of (opaque) prism 138 to be directed at mirror 113 (the same as in FIG. 16). Thus the reflective face 137 is analogous to the transparent opening of slit 112 in the apparatus of FIG. 16. The twin of each pulse emitted by fiber 134 is emitted 2 ns later from fiber 135, and directed by anamorphic beam expander 140 to face 141 of prism 138, which then directs the light to mirror 113 and then to the crystal. Because of the timing of the laser pulses, in combination with the relative delay in fibers 134 and 135, every 4 ns a cycle repeats with first a 1 ns pulse reflected from face 137 to mirror 113, then a 1 ns dark interval, then a 1 ns pulse reflected from face 141 to mirror 113, then another 1 ns dark interval, etc. This will cause the analog in FIG. 17 of line 117 in FIG. 16 to shift back and forth by a small distance, on the order of a micron, on a 4 ns cycle. Reflecting face 150 on prism 151 is conjugate to face 137, so that when the laser pulse is reflected from face 137 and focused to a line in the crystal, light emanating from that line is focused to face 150. Similarly when light reflected from face 141 is focused to a line in the crystal, light emanating from that line is focused to face 152 of prism 151. The light reflected from faces 150 and 152 is directed (perhaps via collecting optics) to photodetectors 153 and 154 respectively. The output of photodetector 153 and 154 is sent to combining circuit 155, which also receives input from laser driver 131, so that 1) the outputs of photodetectors 153 and 154 are gated to zero except for the 1 ns during each 4 ns cycle when they receive light from their corresponding illuminated line in the crystal 2) the gated output of detector 154 is subtracted from the gated output of detector 153 to produce a combined output 3) by means of a gain control on the output of one of the detectors, the gated output of the two photodetectors are matched as closely as possible, when examining a defect free crystal, so that the combined output (summated over the full 4 ns cycle) is zero under those circumstances. When the combined output from circuit 155 is non-zero for a series of consecutive 4 ns cycles, this is a strong indication of a scattering particle in the field of the line illuminated by light reflected from face 137 but not the line illuminated by light reflected from face 141 or vice versa, in other words, that a scattering particle is just entering or exiting the field of illumination from light reflected from faces 137 and 141.

The method illustrated in FIGS. 13, 14 and 15 shows an attempt to provide the advantages of roll to roll processing using individual wafers produced by cleaving a crystal boule. However it is possible to grow crystals of both silicon and sapphire in the form of ribbons. These ribbons are believed to potentially be much thinner than would be feasible with known processes for drawing ribbons from a melt. And silicon in the form of a long ribbon should be far easier to work with than the arrangement described in FIGS. 13, 14 and 15. By beginning with a ribbon produced by state of the art ribbon production process, that ribbon can be made thinner, for increased flexibility and in some cases photovoltaic energy conversion efficiency, and of course a multiplication of the area produced. This a method of cleaving ribbons in cleavage planes parallel to the surface of the ribbon not only at least doubles the area of ribbon produced, but makes a more valuable product. And long lengths of such ribbon can be wound onto rolls for roll to roll processing, that has clear advantages over the method shown in FIGS. 13, 14 and 15.

Figure 18:
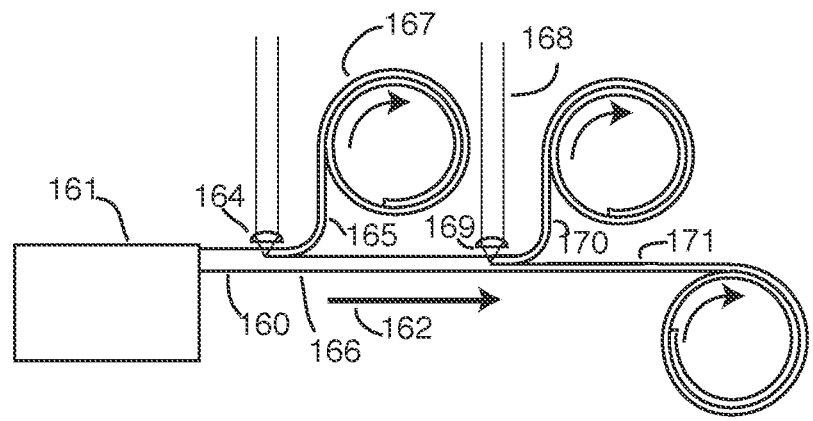
FIG. 18 is a schematic cross sectional view showing how a ribbon wafer of silicon, sapphire or a similar material can be cleaved in planes parallel to the face of the ribbon, to create three ribbons of one third of the thickness of the original ribbon.

Crystalline ribbons of silicon and sapphire have been grown by vertical processes such as the EGF method and by horizontal processes such as taught for example in U.S. Pat. No. 7,855,087. While the present invention can be used with either a vertical or horizontal process, FIG. 18 illustrates its use with the horizontal method. A ribbon of silicon or sapphire 160 is drawn from the melt in crucible 161 and pulled in the direction of arrow 162. Pulsed laser beam 163 focused by cylindrical lens 164 induces cleavage between so that ribbon 160 bifurcates into a thinner ribbon 165 and 166. The ribbon 165 is wound into a roll. The thicker ribbon 166, following cleavage, continues in the direction of arrow 162. A second pulsed laser beam 168, focused by cylindrical lens 169, produces a second cleavage, to bifurcate ribbon 166 into ribbons 179 and 171 which are wound on respective rolls (unlabeled). The number of rolls of ribbons produced by this method is arbitrary, so that if the width of ribbon 160 were 400 μm, it would be possible to create 16 rolls of ribbon, each ribbon with a 20 μm thickness. In this way it may be possible to create thin ribbons of crystal, adapted for roll to roll processing, extremely economically. It should be said that the initiation of the cleavage could be done as described earlier in this specification, starting with a notch. But the initiation process, once began, will not have to be repeated on any ribbon, until the rolls have reached their maximum lengths.

Figure 19:
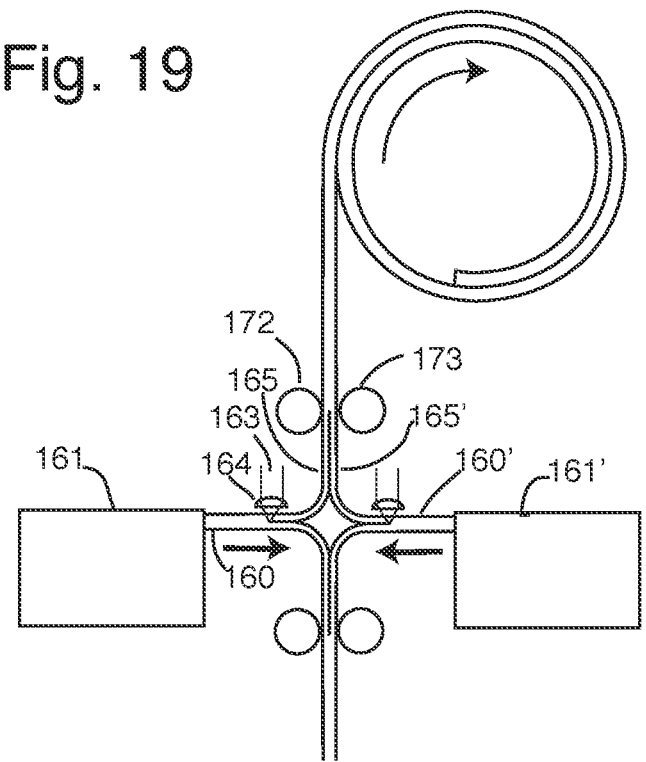
FIG. 19 is a schematic cross sectional view showing how ribbons, perhaps of different compositions and/or crystal orientations, and pulled by a horizontal float process from two different crucibles, can each be cleaved in half, to create two ribbons of the same width but half the thickness of the original ribbon, and then the newly formed ribbons laminated to form new ribbons, each combining ribbons from the different crucibles.

FIG. 19 shows how the ribbons cleaved from the ribbon originally pulled from the melt in a ribbon process, can be laminated together with the ribbon cleaved from another melt. The numerals for the elements for the left hand crucible and ribbon are the same as in FIG. 18, while the numerals for the right hand crucible and ribbon are shown by primes. The process of bonding the two ribbons could be facilitated by pressure, heat, ultrasonic energy, laser irradiation etc. As an example of such a process to facilitate such bonding, the two rollers 172 and 173 are shown for applying pressure, perhaps in conjunction with some other energy input.

The two ribbons that are laminated in the apparatus shown in FIG. 19 could be of the same material, eg., silicon or sapphire, but have different crystal orientations, so that, like plywood, that the laminate is stronger than its component layers. Also the laminate can be from two different forms of the same material, for example p-doped and n-doped silicon, so that the lamination process can create heterojunction photovoltaic cell. It is also possible for the two ribbons laminated together to be of different substances, for example one of silicon and the other of sapphire. Such a laminate could provide a cell with the durability of sapphire combined with the photovoltaic efficiency of silicon. When sufficiently thin, both silicon and sapphire have a low cost per unit area, so if the production costs could be low enough, this particular laminate might be competitive with conventional building skins that do not offer photovoltaic conversion.

The particular schematic diagram shown in FIG. 19 does not appear to offer much physical space for any additions to either cleaved ribbon from the time it is produced to the time it is laminated. However by simply rearranging the geometry, there would be space for a wide range of modifications, such as adding conductive layers. A particularly useful modification might be the insertion of an intermediate layer between the two laminated cleaved ribbons 165 and 165' in FIG. 19. Such an intermediate layer could improve the strength per weight per unit area, by the use of a light weight plastic between two outer layers of sapphire. The intermediate layer could also improve adhesion between the outer layers.

The cleaving method of the present invention has been described with reference to silicon and sapphire, however other crystalline materials such as germanium, gallium arsenide, silicon carbide and diamond also have sharp transitions from transparency to opacity at a particular critical wavelength, so could be used in a similar wafer-cleaving scheme. In general the requirement for the present technique is that for at least one wavelength, the material is relatively transparent for low intensities, where single photon absorption predominates, but is relatively opaque at high intensities where two-photon or three-photon absorption is significant.

One of the goals of this technique was to provide a technique that could be carried out a room temperature and in a normal atmosphere or a vacuum environment. However it may be that under some circumstances, other conditions produce better results.

The present invention has been described here as focusing light on the desired cleavage plane, using two-photon or three-photon absorption of that light to produce selective heating of the focal volume, however other types of radiation that have the properties of allowing formation of a local heated region in a crystal, without substantial heating of the overlying layers and without leaving any permanent damage to the crystal, might substitute for light and multi-photon absorption.

The volume of the specimen onto which the light from laser 10 was focused in the embodiment described in this specification was a single approximate cylinder with an axis parallel to the growing fracture edge, and elongated in the dimension of the ingot axis to have a generally oval cross section. However alternatively shaped illuminated volumes may be advantageous in some applications of the present invention, for example a disjoint volume including two such distorted cylinders of illumination, one ahead of the cleavage growth front and the other behind the front, so that the two regions together provide a tensile stress field around the growing fracture, that causes the forces to more precisely be normal to the plane of the fracture, or are more tolerant to errors in the depth of focusing of the illuminated volume(s) in relationship to the plane of the desired cleavage.

This description has described the ingot of silicon as oriented in the (111) axis, however for some uses, some other orientation of the wafers may be desirable, and substitute for the (111) orientation. It may even be possible to apply this technique in amorphous solids such as fused silica with no preferred cleavage planes; since the tensile forces are applied so precisely at the growing fracture front, a planar fracture may be possible in the absence of a crystal cleavage plane. In the case of fused silica, for example, an intense pulse at 0.3 micron wavelength could induce two-photon absorption or a pulse at 0.45 microns could induce three-photon absorption, and hence rapid local heating required to implement the present invention.

This method of wafer production has been presented herein as an alternative to the method of layer weakening by hydrogen ion implantation, however it might also be used in conjunction with this technique, allowing a smaller does of ions, and a shorter annealing time, for faster throughput and lower cost.

In the case of sapphire, the crystal is transparent at wavelengths above about 250 nm. Therefore it might be possible to use the widely available titanium-sapphire mode-locked laser tuned to 800 nm, and frequency tripled to 266 nm by BBO crystals (Eskma Optics, Vilnius, Lithuania). Such light then can be absorbed by two photon absorption in the sapphire crystal. Light of an appropriately longer wavelength will be too long for two photon absorption, but can be efficiently absorbed in the sapphire crystal by three-photon absorption.

This specification described the cleavage being triggered at a notch. However other additions or subtractions to crystal that will initiate a fracture at the chosen cleavage plane when exposed to tensile stress could substitute for such a notch, and may include volumes where the crystal structure was weakened due to exposure to focused beams of various kinds of radiation.

Thus the scope of the invention should not be limited to the embodiments described but rather to the following claims.

The invention claimed is:

1. A method for producing planar fracture at a chosen plane in a mass of material having at least one flat surface, wherein said chosen plane is parallel to said flat surface, wherein said material is in a class comprising single crystals, in which case said chosen plane is a crystallographic plane, and comprising amorphous materials lacking crystallographic planes, providing a beam of radiation that passes through said surface in a direction normal to said chosen plane to converge on a focal region at said chosen plane, timing said beam so it heats said focal region rapidly enough to induce tensile stresses in the interior of said material sufficient to induce fracture at a chosen location in said chosen plane, wherein said tensile stresses are generally perpendicular to said chosen plane at said chosen location, thereby increasing the likelihood that the resulting fracture will take place in said chosen plane compared to taking place in another potential fracture plane intersecting said chosen location, and moving the focus of said radiation and/or moving said mass of material to create relative movement between said focus and said material, thereby creating relative movement between said material and the region in said material heated by said focus, to spread said fracture over said chosen plane, thereby fracturing said material at said chosen plane.

2. The method of claim 1 wherein said material is in a class comprising silicon, germanium, sapphire, diamond, gallium arsenide, salts and fused silica.

3. The method of claim 1 wherein the step of providing a beam of radiation includes the step of providing said radiation adapted to heat said material by a multiphoton absorption process, such that the intensity of said radiation near said focal region in said block is great enough that said absorption is efficient, causing local heating, but away from said focal region in said material said intensity is low enough that absorption is inefficient, producing relatively little heating.

4. The method of claim 3 wherein said radiation has a wavelength between 1 and 3.5 microns.

5. The method of claim 3 wherein the source of said radiation comprises a mode-locked laser.

6. The method of claim 1, wherein the step of providing a beam of radiation comprises providing a cylindrical lens.

7. The method of claim 1 wherein said mass of material is shaped in the form of a ribbon, wherein said ribbon shaped mass grows continually by solidification from a molten form of said material to form a continuous ribbon, and wherein said planar fracture, carried out by the method of claim 1 is applied to said continuous ribbon as it grows, subdividing said ribbon into two thinner ribbons.

8. The method of claim 7, wherein at least one of said thinner ribbons is fractured into still thinner ribbons by the method of claim 1.

9. The method of claim 7 wherein said material has a lower density in the solid state than in the liquid state, wherein said mass of material is in the solid state and floats on the surface of a molten form of said material, wherein said ribbon increases its size due to solidification in the horizontal dimension, and wherein said ribbon moves in the horizontal direction so the location where such solidification takes place remains relatively constant relative to said molten form of said material.

* * * * *